United States Patent
Huang et al.

(10) Patent No.: US 6,808,866 B2
(45) Date of Patent: Oct. 26, 2004

(54) PROCESS FOR MASSIVELY PRODUCING TAPE TYPE FLEXIBLE PRINTED CIRCUITS

(75) Inventors: Jung-Chou Huang, Kaohsiung (TW);
Wen-Yann Su, Fengshan (TW);
Kuei-Hao Pang, Fengshan (TW);
Grow-Hao Lo, Pingtung (TW);
Che-Hui Chu, Kaohsiung (TW)

(73) Assignee: Mektec Corporation, Kaohsiung (TW)

( * ) Notice: Subject to any disclaimer, the term of this patent is extended or adjusted under 35 U.S.C. 154(b) by 164 days.

(21) Appl. No.: 10/135,357

(22) Filed: May 1, 2002

(65) Prior Publication Data

US 2003/0207211 A1 Nov. 6, 2003

(51) Int. Cl.⁷ .................................................. G03F 7/00
(52) U.S. Cl. ...................... 430/313; 430/311; 430/314; 430/318; 430/320
(58) Field of Search ................................ 430/311, 313, 430/314, 318, 320

(56) References Cited

U.S. PATENT DOCUMENTS

| | | | | |
|---|---|---|---|---|
| 4,411,982 A | * | 10/1983 | Shibuya et al. | 430/314 |
| 5,397,917 A | * | 3/1995 | Ommen et al. | 257/698 |
| 5,479,109 A | * | 12/1995 | Lau et al. | 324/758 |
| 6,210,518 B1 | | 4/2001 | Lee et al. | 156/289 |

* cited by examiner

*Primary Examiner*—Mark F. Huff
*Assistant Examiner*—Nicole Barreca
(74) *Attorney, Agent, or Firm*—Troxell Law Office PLLC

(57) ABSTRACT

A process for massively producing tape type flexible printed circuits is provided. The steps of pressing, etching and insulating are executed on a flexible insulation tape in reel-to-reel fashion. Thereafter, the flexible insulation tape is punched to form sprocket holes and cut along the parallel lines where the sprocket holes arrange on to become several winds of narrower flexible circuit tapes. Each flexible circuit tape has tape type flexible printed circuits and sprocket holes at two sides.

12 Claims, 5 Drawing Sheets

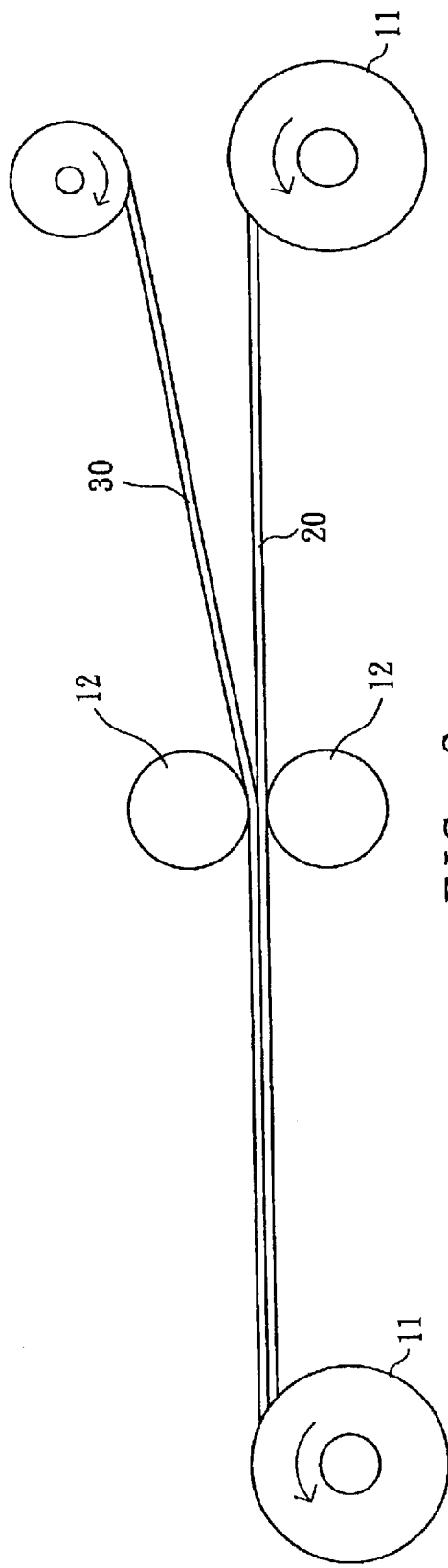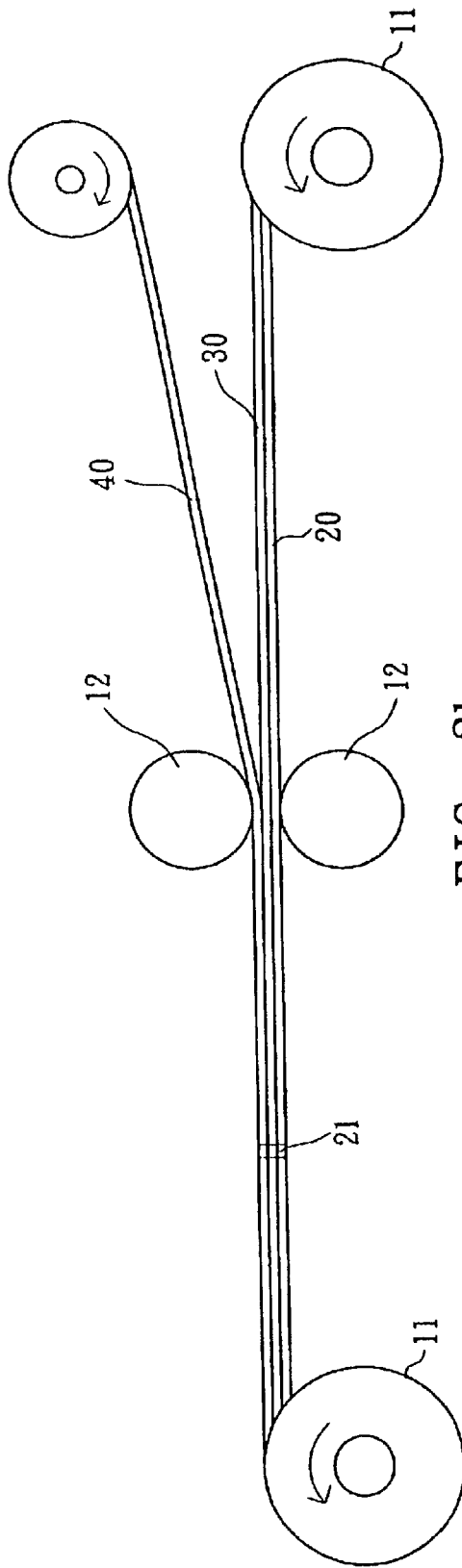

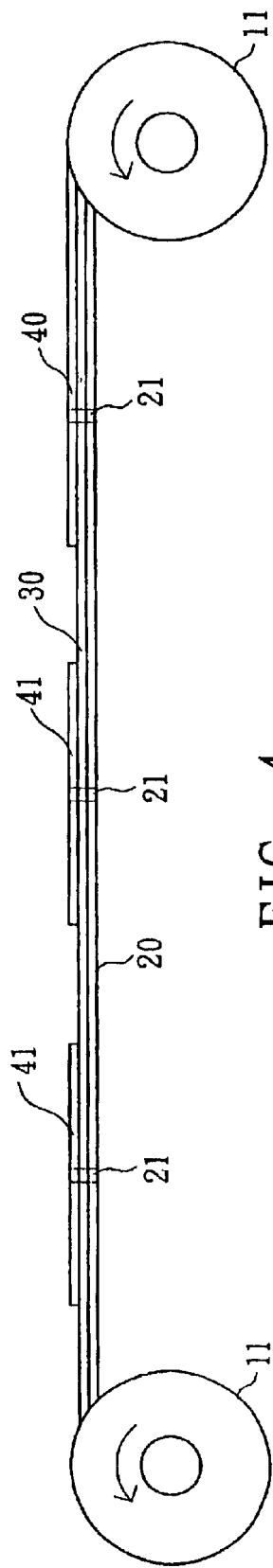
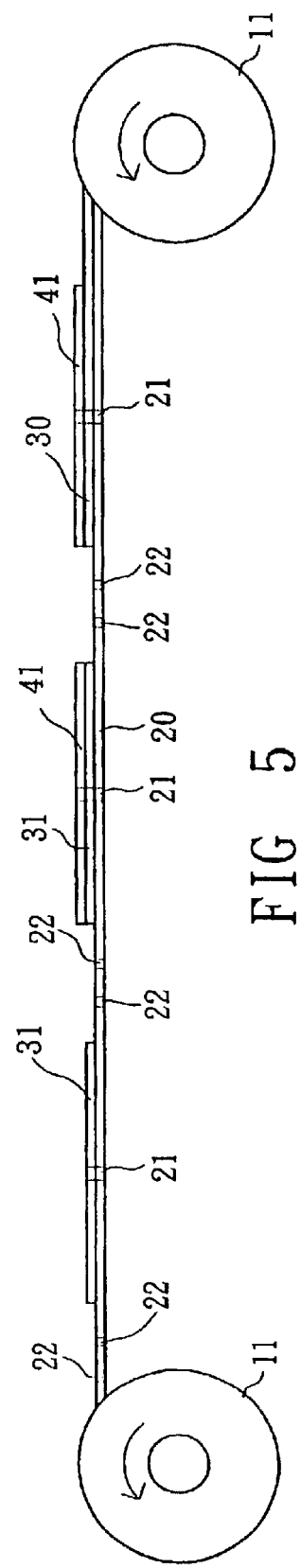

PROCESS FOR MASSIVELY PRODUCING TAPE TYPE FLEXIBLE PRINTED CIRCUITS

FIELD OF THE INVENTION

The present invention generally relates to a process for massively producing tape type flexible printed circuits with sprocket holes, particularly to a flexible fabrication process for massively producing tape type flexible printed circuits which are applied to electrical connectors, such as electrical connections between driver and display panel, and between foldable electronic components, also even as a chip carrier of semiconductor package like Chip-On-Film package or tape carrier package, wherein the tape width of the tape type flexible printed circuits can be selected in a very flexible manner.

BACKGROUND OF THE INVENTION

Flexible printed circuits that can be bent and twisted are widely applied to the electrical connection between two electronic components. A common flexible printed circuit is installed in a LCD (liquid crystal display) module as an electrical connection between LCD panel and rigid printed circuit board.

A method for manufacturing flexible printed circuits is disclosed in U.S. Pat. No. 6,210,518, but that has not mentioned how to massive produce flexible printed circuits, so that the manufacturing cost of flexible printed circuits cannot be decreased effectively. Besides, among advanced electronic products the flexible printed circuits of beyond 0.2 mm in thickness are no longer satisfied by market, so that how to massively produce the flexible printed circuits under 0.2 mm in thickness (flexible tape type) is a point to be solved imperatively.

SUMMARY

It is a main object of the present invention to provide a process for massively producing tape type flexible printed circuits. The metal traces and cover layer are formed on a flexible insulation tape with big area in reel-to-reel fashion, and the flexible insulation tape is cut along the parallel lines where sprocket holes arrange on to become several strips of small flexible circuit tapes with variable width, then reeled in reels. Therefore, it is possible to massively produce tape type flexible printed circuits with low cost and with variable width by means of a set of manufacturing system.

In accordance with the process for massively producing tape type flexible printed circuits, a copper foil and a dry film are sequentially bonded on a flexible insulation tape which is made of polyimide, polyester, polyethylene naphthalate, liquid crystal polymer, or Teflon in reel-to-reel fashion, and a first standard point is set on the flexible insulation tape. Thereafter, the copper foil is etched to form metal traces, and sequentially cover films are attached on the flexible insulation tape. Then surface treating is executed. Next, the sprocket holes are formed on the flexible insulation tape by punching and the flexible insulation tape is cut along the parallel lines where the sprocket holes arrange on to become several strips of narrow flexible circuit tapes, then reeled in reels. Each flexible circuit tape has a plurality of flexible printed circuits between two sides of sprocket holes. It is preferable that there is an electrical test step right after cutting step for testing the flexible printed circuits and marking the defectives.

DESCRIPTION OF THE DRAWINGS

FIG. 3a is a side view showing the flexible insulation tape in the step of sequentially pressing a copper foil in accordance with the process for massively producing tape type flexible printed circuits of the present invention.

FIG. 3b is a side view showing the flexible insulation tape in the step of sequentially pressing a dry film in accordance with the process for massively producing tape type flexible printed circuits of the present invention.

FIG. 4 is a side view showing the flexible insulation tape in the step of developing in accordance with the process for massively producing tape type flexible printed circuits of the present invention.

FIG. 5 is a side view showing the flexible insulation tape in the step of etching in accordance with the process for massively producing tape type flexible printed circuits of the present invention.

DETAILED DESCRIPTION OF THE PRESENT INVENTION

Figure 1:
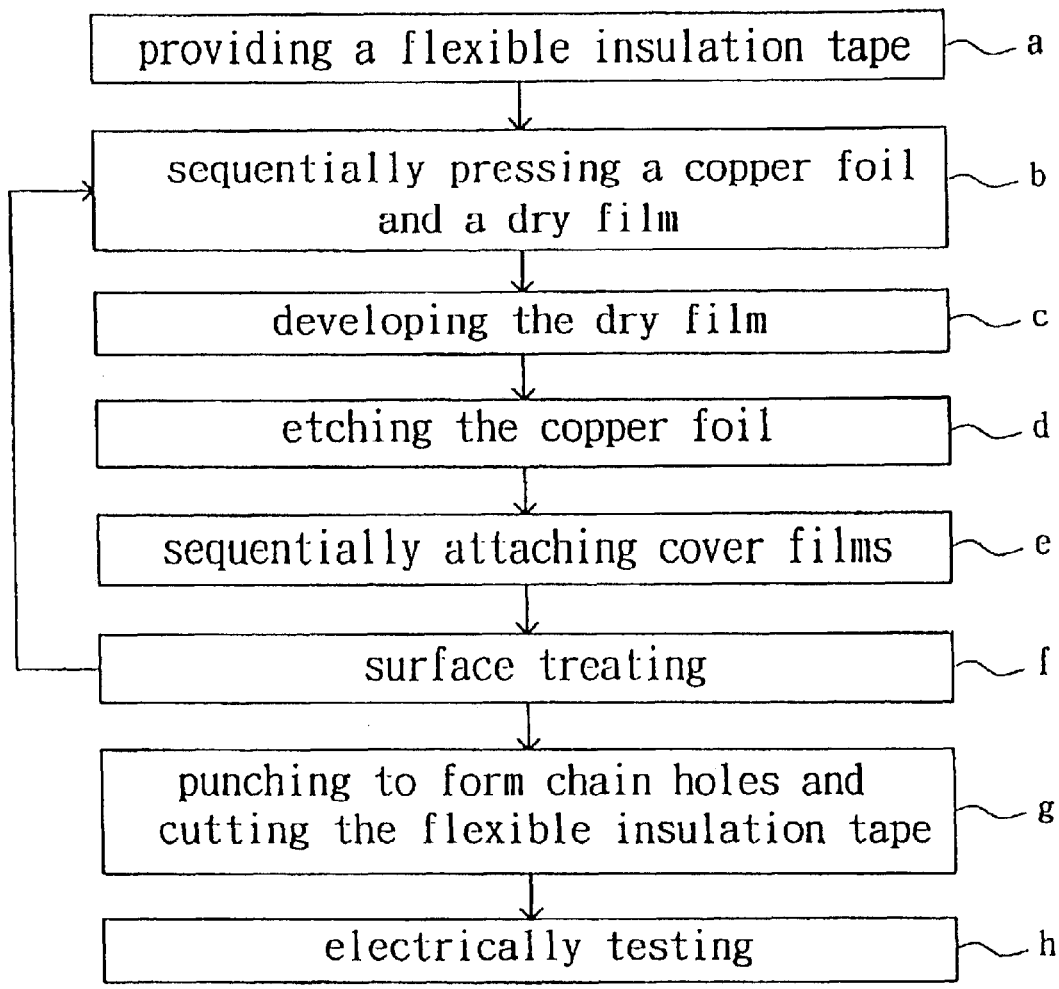
FIG. 1 is a process flowchart for massively producing tape type flexible printed circuits in accordance with the present invention.

Referring to the drawings attached, the present invention will be described by means of the embodiments below.

FIG. 1 shows a flowchart of a process for massively producing tape type flexible printed circuits of the present invention. A flexible insulation tape in the flowing procedures is shown from FIG. 2 to FIG. 8.

As shown in FIG. 1, the process for massively producing tape type flexible printed circuits of the present invention comprises: step (a) of "providing a flexible insulation tape", step (b) of "sequentially pressing a copper foil and a dry film", step (c) of "developing the dry film", step (d) of "etching the copper foil", step (e) of "sequentially attaching cover films", step (f) of "surface treating", step (g) of "punching to form sprocket holes and cutting the flexible insulation tape", and step (h) of "electrically testing".

Figure 2:
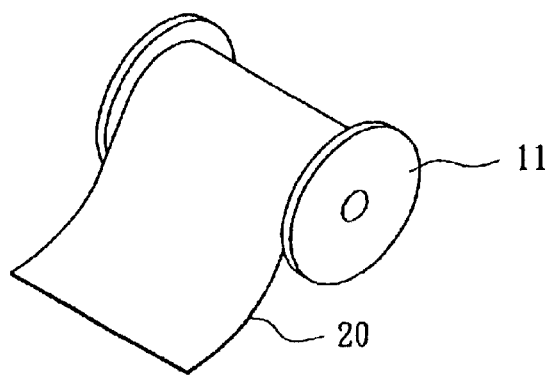
FIG. 2 is a three-dimensional diagram showing a provided flexible insulation tape reeled on a reel in accordance with the process for massively producing tape type flexible printed circuits of the present invention.

As shown in FIG. 2 in the step (a) of "providing a flexible insulation tape", a flexible insulation tape 20 that is reeled in a reel 11 is prepared. The flexible insulation tape 20 is made of polyimide (PI), Polyether (that is polyethylene terephalate (PET)), polyethylene naphthalate (PEN), liquid crystal polymer (LCP), or Teflon. In this embodiment the flexible insulation tape 20 is a polyimide film and has a thickness about 10~75 μm, usually it is 25 μm approximately.

The step (b) of "sequentially pressing a copper foil and a dry film" is shown in FIGS. 3a and 3b. As shown in FIG. 3a, at first the flexible insulation tape 20 is reeled out from a reel 11 and reeled in another reel 11. The copper foil 30 is also reeled out from a reel, then sequentially pressed on the flexible insulation tape 20 by a laminator 12 between two reels 11 so that the flexible insulation tape 20 with copper foil 30 is reeled in another reel 11. The thickness of the copper foil 30 is about 5~40 μm, usually it is 18 μm approximately. Thereafter as shown in FIG. 3b, the flexible insulation tape 20 with copper foil 30 is reeled out from a reel 11 again and sequentially presses a dry film 40 by a laminator 12. The dry film 40 is a kind of photoimagible film such as positive photoresist or negative photoresist. The flexible insulation tape 20 with copper foil 30 and dry film 40 is reeled in a reel 11 after pressing step (b). During pressing, it is better to set a plurality of first standard points 21 at the flexible insulation tape 20, such as punching through holes, for positioning the flexible insulation tape 20 in following steps. In another embodiment, the flexible insulation tape 20 with copper foil 30 may be provided directly from supplier, it is only needed to press the dry film 40 during the pressing step (b).

In the step (c) of "developing the dry film", as shown in FIG. 4, according to the first standard points 21 the flexible insulation tape 20 is reeled out to a suitable location and length, then the dry film 40 is developed to form a patterned dry film 41. Due to the first standard points 21 for positioning, the step (c) is executed repeatedly so that there is a fixed interval between each developed portion and adjacent developed portion on the flexible insulation tape 20 and each developed portion is one by one and neatly arranged without declination.

As shown in FIG. 5, in the step (d) of "etching the copper foil", the flexible insulation tape 20 with patterned dry film 41 is reeled out and etched. By means of copper chloride etching liquid, the portions uncovered by the patterned dry film 41 are etched to make the copper foil 30 form metal traces 31 for electrical connection. Thereafter, the patterned dry film 41 is removed by alkaline liquid for exposing the metal traces 31. Then the flexible insulation tape 20 is reeled in reel 11 after backing and setting a plurality of second standard points 22.

Figure 6:
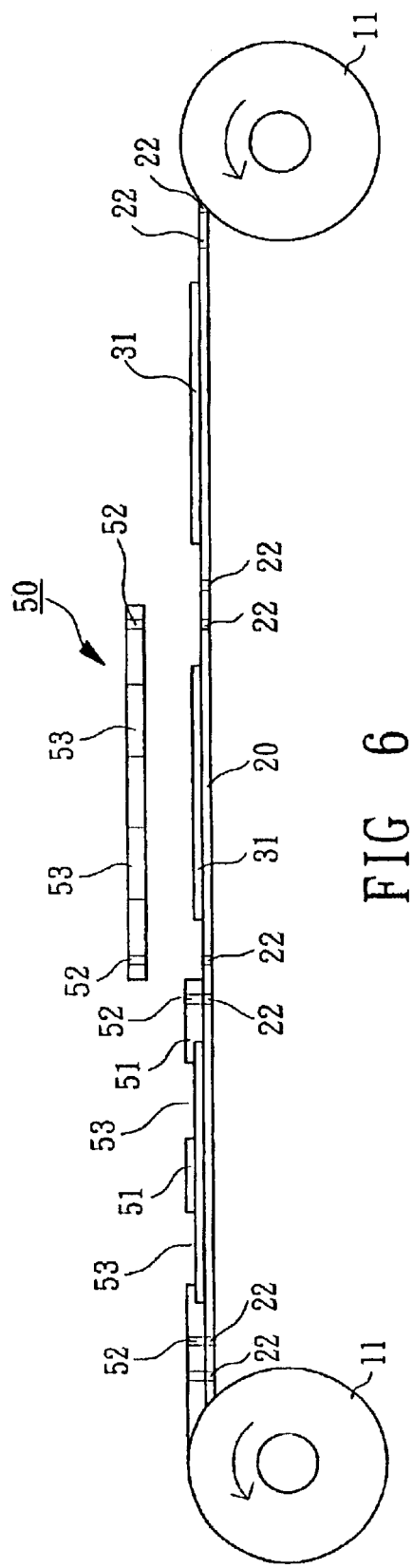
FIG. 6 is a side view showing the flexible insulation tape in the step of attaching cover films on in accordance with the process for massively producing tape type flexible printed circuits of the present invention.

As shown in FIG. 6, in the step (e) of "sequentially attaching cover films", the flexible insulation tape 20 with metal traces 31 is reeled out and a plurality of cover films 50 are sequentially attached on the flexible insulation tape 20 with determined pressure. The cover films 50 are made of insulation materials such as polyimide, polyester, PEN, or LCP and have a thickness about 10~75 μm, usually it is 25 μm approximately. The cover films 50 have hollow portions 53 and standard holes 52 in advance. During attaching the standard holes 52 of the cover films 50 are pointed to the second standard points 22 of flexible insulation tape 20, the cover films 50 are combined to become a cover layer 51 on the flexible insulation tape 20 for protecting the metal traces 31 and exposing connection terminals of the metal traces 31. Alternatively, the cover layer 51 also can be a solder mask formed by mask printing or mask spraying, wherein the solder mask is a liquid photoimagible solder mask. Executing a developing step for the solder mask is necessary to form hollows portions 53 of the cover layer 51.

Figure 7:
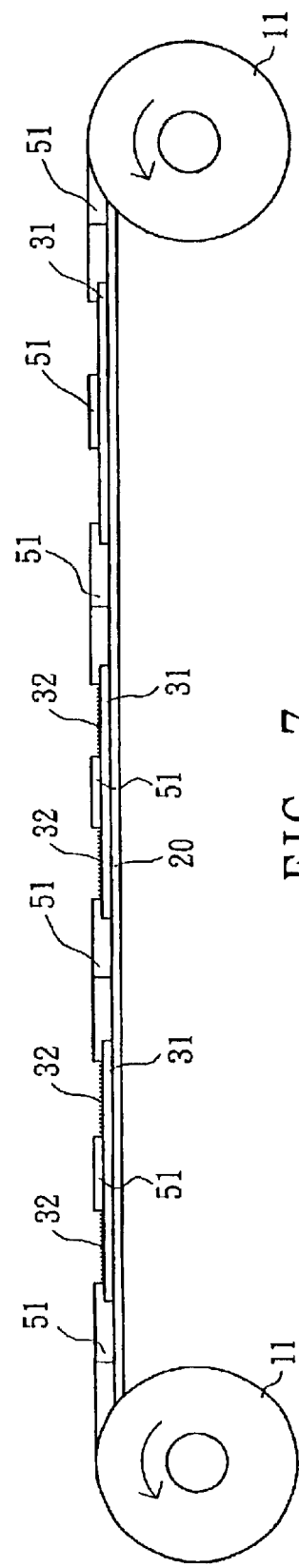
FIG. 7 is a side view showing the flexible insulation tape in the step of surface treating in accordance with the process for massively producing tape type flexible printed circuits of the present invention.

As shown in FIG. 7, in the step (f) of "surface treating", the treatments of electroplating, tin paste printing, heat resistance, and anti-rust are executed on the flexible insulation tape 20 with cover layer 51 to make the exposed ends of metal traces 31 form an electroplating layer 32 or protruding electrodes, etc. The electroplating layer 32 is formed by non-electrolysis electroplating, gold electroplating, or tin-lead electroplating method. Also the flexible insulation tape 20 is reeled in a reel 11 after completing the step (f) of "surface treating". Preferably, from step (b) to step (f) are repeated until enough layers of the metal traces are formed on the flexible insulation tape 20.

Figure 8:
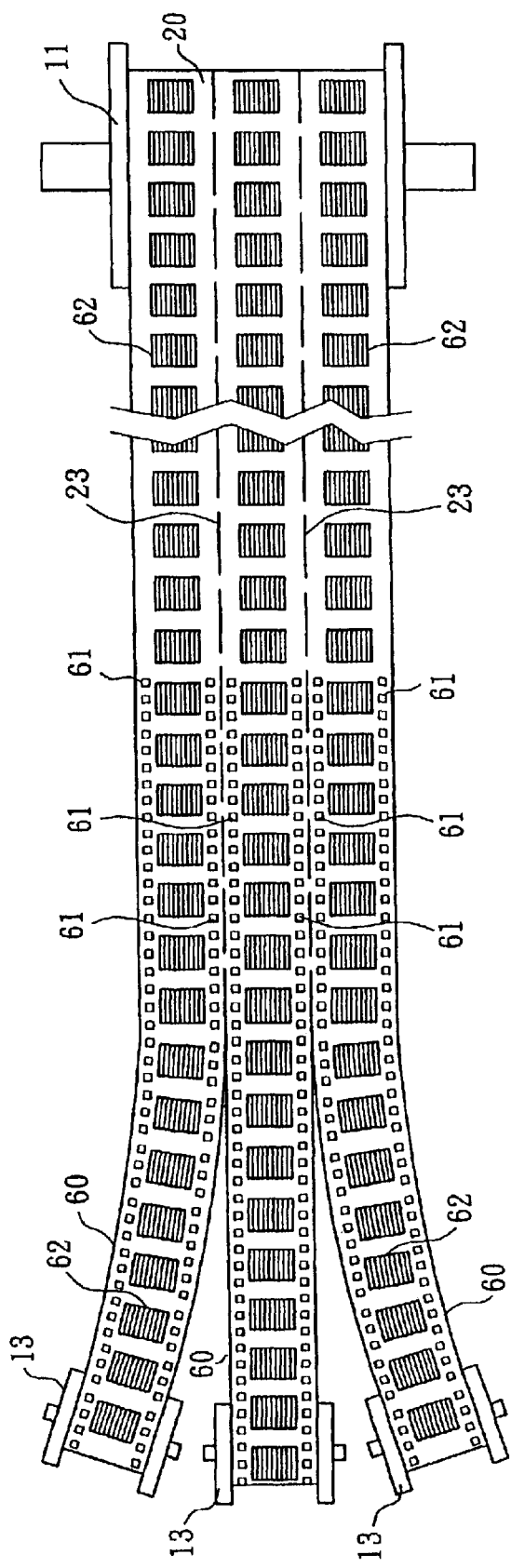
FIG. 8 is a front view showing the flexible insulation tape in the step of punching and cutting in accordance with the process for massively producing tape type flexible printed circuits of the present invention.

The step (g) of "punching to form sprocket holes and cutting the flexible insulation tape" is shown in FIG. 8. The flexible insulation tape 20 passing the step (f) of surface treating is reeled out and punched to form a plurality of sprocket holes 61 which arrange on a plurality of parallel lines at even number. In this embodiment, the flexible insulation tape 20 is wide enough to arrange three rows of tape type flexible printed circuits 62. The sprocket holes 61 are formed at the two sides of each row of the tape type flexible printed circuits 62. Then, the flexible insulation tape 20 is cut along parallel lines 23 parallel to where the sprocket holes 61 arrange on by cutting or punching method, so that the flexible insulation tape 20 is divided to several narrow flexible circuit tapes 60 and reeled in the reels 13. Besides, each flexible circuit tape 60 has a plurality of tape type flexible printed circuits 62 with two rows of sprocket holes 61. After the flexible circuit tapes 60 are formed, it is preferable to execute step (h) of "electrically testing" for testing the flexible circuit tapes 60 and marking the defective tape type flexible printed circuits 62. Usually marking holes are formed on/around the defective tape type flexible printed circuits 62 for distinction without separating or getting rid of defectives. Finally, the known-good completed tape type flexible printed circuits 62 and the marked defectives are reeled in the reels 13.

According to the process for massively producing tape type flexible printed circuits mentioned above, several winds of flexible circuit tapes 60 with single-layer circuits can be manufactured simultaneously. The cross-sectional structure of tape type flexible printed circuits 62 is shown as FIG. 9. The process is not only to provide a massive production of tape type flexible printed circuits 62, but also can manufacture various width of flexible circuit tapes 60 having tape type flexible printed circuits (such as 35 mm, 48 mm, 70 mm for width) by means of a same set of producing equipment only. When a wider or narrower tape type flexible printed circuits 62 are going to be manufactured, a flexible insulation tape 20 having a width about 250 mm is provided to execute the step (b) of "sequentially pressing a copper foil and a dry film", the step (c) of "developing the dry film", the step (d) of "etching the copper foil", the step (e) of "sequentially attaching cover films", and the step (f) of "surface treating", etc. Next in the step (g) of "punching to form sprocket holes and cutting the flexible insulation tape", the cutting paths should be changed to form the flexible circuit tapes with appropriate width. (for example, a provided flexible insulation tape having a thickness about 250 mm can be divided to 3 reels for width 70 mm, 4 reels for width 48 mm or 5 reels for width 35 mm of flexible circuit tapes 60). Therefore, the present invention can massively manufacture various kinds of standard width of tape type flexible printed circuits 62 by a same set of producing equipment so as to reach the effects of massive production and elastical manufacture. Besides, completed flexible circuit tapes 60 are reeled in reels 13 not only to keep the packaging cost low but also to provide customers an automatic assembly.

Figure 9:
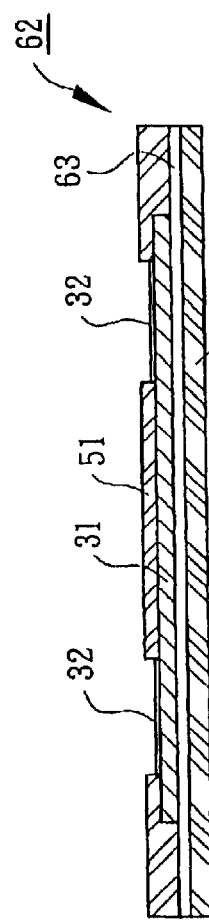
FIG. 9 is a cross-sectional view of manufactured tape type flexible printed circuits in accordance with the process for massively producing tape type flexible printed circuits of the present invention.

As shown in FIG. 9 in accordance with the process for massively producing tape type flexible printed circuits 62 mentioned above, completed tape type flexible printed circuits 62 includes a flexible insulated layer 64 which is made of polyimide, polyester, polyethylene naphthalate, liquid crystal polymer, or Teflon. The flexible insulated layer 64 has a thickness about 10~75 μm, also a plurality of metal traces 31 and a cover layer 51 are formed thereon (for example, adhesive 63 adhering copper foil, or a copper foil is directly pressed on the flexible insulated layer 64 with non-solidifying condition). The metal layer 31 has a thickness about 5~40 μm and the thickness of the cover layer 51 is 10~75 μm approximately, so the entire thickness of tape type flexible printed circuits 62 is thinner than 0.2 mm. The metal traces 31 have electroplating layers 32 or protruding electrodes at the hollow portion 53 of protective layer 51. Therefore, the tape type flexible circuits board 62 that can be massively produced is extremely suitable for electrically connecting, such as connecting display panel and printed circuit board, and widely applied to LCD display, notebook computer, PDA and cell telephone, etc, even being chip carrier of semiconductor package.

Besides, according to the process for massively producing tape type flexible printed circuits of the present invention, the step (b) of "sequentially pressing a copper foil and a dry film", the step (c) of "developing the dry film", the step (d) of "etching the copper foil", the step (e) of "sequentially attaching cover films", and the step (f) of "surface treating" are repeatedly executed until enough layers of metal traces 31 are formed on the flexible insulation tape 20. Thereafter, several winds of flexible circuit tapes with multi-layer circuit structure may be manufactured after completing the step (g) of "punching to form sprocket holes and cutting the flexible insulation tape" and the step (h) of "electrically testing".

The above description of embodiments of this invention is intended to be illustrated and not limiting. Other embodiments of this invention will be obvious to those skilled in the art in view of the above disclosure.

What is claimed is:

1. A process for massively producing tape type flexible printed circuits comprising the steps of:
   (a) providing a flexible insulation tape reeled in a reel, the flexible insulation tape having a plurality of parallel cutting lines and a plurality of rows of circuit regions;
   (b) pressing a copper foil, pressing a dry film on the flexible insulation tape setting first standard points;
   (c) positioning the flexible insulation tape by the first standard points, developing the dry film to form a pattern;
   (d) etching the copper foil to form metal traces, removing the dry film;
   (e) attaching cover films on the flexible insulation tape;
   (f) surface treating the flexible insulation tape to make exposed portions of the metal traces form an electroplating layer; and
   (g) punching the flexible insulation tape to form a plurality of sprocket holes on opposing sides of each of the plurality of rows of circuit regions along the parallel cutting lines; and separating the flexible insulation tape along the parallel cutting lines by a cutting or punching method to form a plurality of flexible circuit tapes with the sprocket holes for reeling the plurality of flexible circuit tapes on sub-reels.

2. The process of claim 1, further comprising: repeatedly executing step (b) to step (f) until enough layers of the metal traces are formed on the flexible insulation tape.

3. The process of claim 1, further comprising a step of electrically testing for testing the flexible circuit tapes and marking the defectives after the punching step (g).

4. The process of claim 1, wherein the flexible insulation tape is made of a material selected from the group consisting of polyimide, polyester, polyethylene naphthalate, liquid crystal polymer, and Teflon.

5. The process of claim 1, wherein the cover films are made of one of polyimide and Teflon.

6. The process of claim 1, further comprising to set second standard points on the flexible insulation tape for positioning the cover films after the etching step (d).

7. A process for massively producing tape type flexible printed circuits comprising the steps of:
   (a) providing a flexible insulation tape having a copper foil on the surface and reeled in a reel, the flexible insulation tape having a plurality of parallel cutting lines and a plurality of rows of circuit regions;
   (b) pressing a dry film on the flexible insulation tape;
   (c) developing the dry film;
   (d) etching the copper foil to form metal traces, removing the dry film;
   (e) forming a cover layer on the flexible insulation tape;
   (f) surface treating the flexible insulation tape to make exposed portions of the metal traces form an electroplating layer; and
   (g) punching the flexible insulation tape to form a plurality of sprocket holes on opposing sides of each of the plurality of row of circuit regions along the parallel cutting lines; and separating the flexible insulation tape along the parallel cutting lines by a cutting or punching method to form a plurality of flexible circuit tapes with the plurality of sprocket holes for reeling the plurality of flexible circuit tapes on sub-reels.

8. The process of claim 7, further comprising:
   repeatedly executing step (b) to step (f) until a predetermined number of layers of the metal traces are formed on the flexible insulation tape.

9. The process of claim 7, further comprising a step of electrically testing for testing the flexible circuit tapes and marking the defectives after the punching step (g).

10. The process of claim 7, wherein the cover layer of the forming step (e) is formed by attaching one of cover films, printing solder mask, and spraying solder mask.

11. The process of claim 7, wherein the flexible insulation tape is made of a material selected from the group consisting of polyimide, polyester, polyethylene naphthalate, liquid crystal polymer, and Teflon.

12. The process of claim 7, wherein the cover layer is made of one of polyimide, polyester, and photoimagible solder mask.

* * * * *